United States Patent
Krishnan et al.

(10) Patent No.: US 8,139,830 B2
(45) Date of Patent: Mar. 20, 2012

(54) SYSTEM AND METHOD FOR AUTOMATED ALIGNMENT OF LEG VOLUMES IN WHOLE-BODY MAGNETIC RESONANCE SCANS

(75) Inventors: Anantha R Krishnan, Plainsboro, NJ (US); Li Zhang, Skillman, NJ (US)

(73) Assignee: Siemens Aktiengesellschaft, Munich (DE)

( * ) Notice: Subject to any disclaimer, the term of this patent is extended or adjusted under 35 U.S.C. 154(b) by 1177 days.

(21) Appl. No.: 11/926,998

(22) Filed: Oct. 29, 2007

(65) Prior Publication Data
US 2008/0108893 A1    May 8, 2008

Related U.S. Application Data

(60) Provisional application No. 60/864,191, filed on Nov. 3, 2006.

(51) Int. Cl.
*G06K 9/00*    (2006.01)

(52) U.S. Cl. .......... 382/128; 600/411; 600/415
(58) Field of Classification Search .......... 382/128
See application file for complete search history.

(56) References Cited

U.S. PATENT DOCUMENTS

| | | | |
|---|---|---|---|
| 7,274,811 B2 * | 9/2007 | Sirohey et al. | 382/128 |
| 2003/0135105 A1 | 7/2003 | Jack et al. | |
| 2006/0052686 A1 * | 3/2006 | Zhang et al. | 600/407 |
| 2006/0155577 A1 * | 7/2006 | Niemeyer | 705/2 |

* cited by examiner

*Primary Examiner* — Phillip A Johnston

(57) ABSTRACT

A method and system for automatically aligning multiple MR volumes in whole-body MR scans is disclosed. The method and system are capable of automatic alignment of leg-volumes in whole-body MR scans that is insensitive to leg movement. In order to align upper and lower MR volumes, an automatic determination may be made that a junction between the upper and lower MR volumes is in a leg region. The lower MR volume is then divided into left and right regions, and each of the left and right regions are independently aligned with the upper MR volume. One of the left and right regions is then adjusted with respect to the other one to compensate for shifting of the legs with respect to each other.

22 Claims, 9 Drawing Sheets

SYSTEM AND METHOD FOR AUTOMATED ALIGNMENT OF LEG VOLUMES IN WHOLE-BODY MAGNETIC RESONANCE SCANS

This application claims the benefit of U.S. Provisional Application No. 60/864,191, filed Nov. 3, 2006, the disclosure of which is herein incorporated by reference.

BACKGROUND OF THE INVENTION

The present invention relates to alignment of magnetic resonance (MR) volumes in whole-body MR scans, and more particularly, to automatic alignment of leg-volumes in whole-body MR scans that is insensitive to leg movement.

Magnetic Resonance (MR) is a well known technique for imaging internal structures of a human body. MR scanners are used to scan portions of the human body resulting in MR volume data (MR volume) representing an MR image of the scanned portion of the body. In whole-body MR scanning of a patient, a set of MR volumes covering the whole body of the patient are obtained using multiple scans. It is then necessary to align (or register) the MR volumes to generate a single MR image of the patients body, referred to as a whole-body composition.

United States Patent Application 2006/0052686 presents a method for aligning multiple MR volumes based on overlapping features in the MR volumes. This method uses multi-scale resolutions of the volumes to speed up correlation between the features in the MR volumes. However, this method assumes that the volumes being aligned are rigid. This assumption is typically correct for imaging of the head, torso, and pelvis, but may not always hold for MR volumes of the legs. The time necessary for MR scans of multiple leg-volumes can be in the order of minutes. In this time, in-scan movement of the legs is possible, especially for a patient whose ability to fully control leg movement is impaired. This can lead to misalignment of the legs in the whole-body composition. Accordingly, an alignment method for leg-volumes that is insensitive to leg movement is desirable.

BRIEF SUMMARY OF THE INVENTION

The present invention provides a method and system for automatic alignment of leg-volumes in whole-body MR scans that is insensitive to leg movement. Embodiments of the present invention separately align left and right portions of a leg-volume and adjust the alignment to compensate for movement of the legs with respect to each other.

In one embodiment of the present invention, upper and lower MR volumes are aligned. The lower MR volume is divided into left and right regions, and each of the left and right regions are independently aligned with the upper MR volume. One of the left and right regions is then adjusted with respect to the other one to compensate for shifting of the legs with respect to each other.

According to another embodiment of the present invention, before aligning the upper and lower MR volumes, it is first automatically determined whether a junction between the upper and lower MR volumes is in a leg region. This determination can be based on a 1D projection profile of an upper portion of the lower MR volume, as well as coil information associated with the upper portion of the lower MR volume.

These and other advantages of the invention will be apparent to those of ordinary skill in the art by reference to the following detailed description and the accompanying drawings.

DETAILED DESCRIPTION

The present invention is directed to a method for automatic alignment of magnetic resonance (MR) volumes. Embodiments of the present invention are described herein to give a visual understanding of the alignment method. A digital image is often composed of digital representations of one or more objects (or shapes). The digital representation of an object is often described herein in terms of identifying and manipulating the objects. Such manipulations are virtual manipulations accomplished in the memory or other circuitry/hardware of a computer system. Accordingly, is to be understood that embodiments of the present invention may be performed within a computer system using data stored within the computer system. For example, according to various embodiments of the present invention, electronic data representing MR volumes is manipulated within a computer system.

According to embodiments of the present invention, the multiple MR volumes covering various portions of a patient's body are automatically aligned in order to generate a whole-body composition, which is a single MR image of the patient's body. The MR volumes may be stored in the DICOM format, which is a well known medical image file format.

Figure 1:
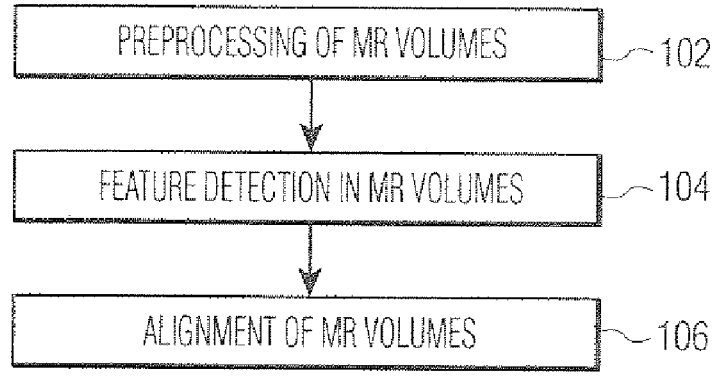
FIG. 1 illustrates a method for aligning two magnetic resonance (MR) volumes.

FIG. 1 illustrates a method for aligning multiple magnetic resonance (MR) volumes. At step 102, preprocessing of the MR volumes is performed. The pre-processing of the MR volumes can include volume shearing and equalization. Information stored in the DICOM header for each MR volume can be utilized in the preprocessing step. Depending on the imaging protocol used to acquire the MR volumes, the MR volumes can exhibit various amounts of distortion (caused by MR image reconstruction). Although most of this distortion can be corrected during the image acquisition phase, it may be advantageous to correct for shearing based on the tilt angle, which is a value stored in the DICOM header for each MR volume. Other parameters, such as relative table position and image position can be used to calculate suggested parameters, which are alignments (shifts in the horizontal, vertical, and depth directions) used for determining a search range. The search range is a range of possible values of alignment parameters from which a best set of values is chosen.

In equalization of the MR volumes, the highest resolution of the MR volumes being processed is selected and all voxels in the MR volumes being processed are normalized to the minimum voxel size. By equalizing the MR volumes, the MR volumes can be properly correlated in a later step.

At step 104, features in the MR volumes are detected by detecting edges in the MR volumes. It may be advantageous to detect reliable features that will be invariant to intensity changes, insensitive to noise, repeatable, and relatively fast to computer For example, a well known Canny edge detector can be used to detect edges in 2D slices of the MR volumes, Strong edges are most often detected at boundaries of anatomical features, such as organs, bones, or vessels. The edge detection generates edge maps of each of the MR volumes. These edge maps are referred to herein as feature volumes. In order to increase computational efficiency, it is possible to detect features only for the search range, i.e., the portions of the MR volumes that will be used to find the alignment values.

At step 106, the MR volumes are aligned based on the detected features. For example, the MR volumes can be aligned by performing normalized cross correlation in order to determine the best alignment of the feature volumes. The normalized cross correlation may be performed by determining a transfer function between two feature volumes that maximizes an objective function that compares the two feature volumes.

As described above, FIG. 1 illustrates a method for aligning multiple MR volumes. This method is described in greater detail in United States Patent Application No. 2006/10052686, which is incorporated herein by reference. However, the method of FIG. 1 does not compensate for the effect of leg movement on the alignment of MR leg-volumes.

Figure 2:
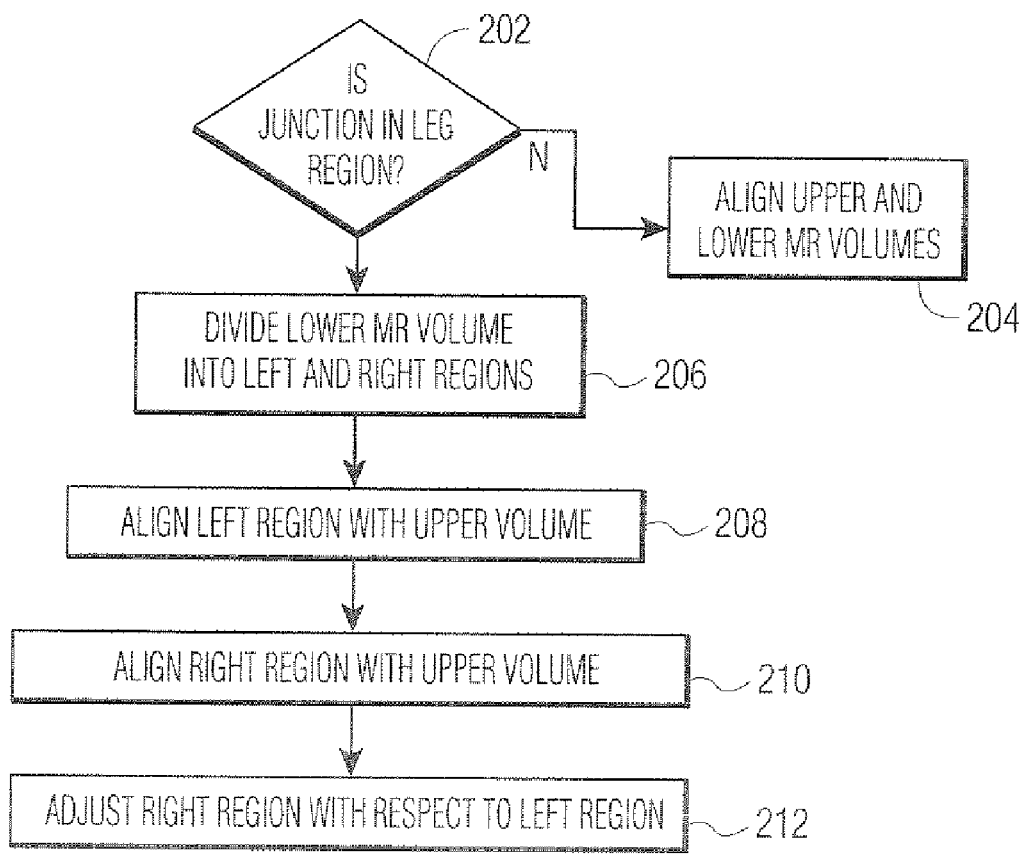
FIG. 2 illustrates a motion-insensitive method for aligning MR volumes according to an embodiment of the present invention.

FIG. 2 illustrates a motion-insensitive method for aligning MR volumes according to an embodiment of the present invention. The method of FIG. 2 can be used to align upper and lower MR volumes. It is to be understood that the method can be repeated multiple times in order to align multiple MR volumes.

At step 202, it is determined whether a junction between the upper and lower MR volumes is in a leg region. The junction between the upper and lower MR volumes is an overlapping or intersecting portion of the upper and lower MR volumes. This step determines whether the junction is part of a leg region or part of a head, torso, or pelvic region. This step is described in greater detail below with reference to FIG. 4. If the junction between the upper and lower MR volumes is not in a leg region, the method proceeds to step 204. If the junction between the upper and lower MR volumes is in a leg region, the method proceeds to step 206.

At step 204, the upper and lower MR volumes are aligned. When the junction between the upper and lower MR volumes is not in a leg region, it is not necessary to compensate for leg movement in the MR volumes and the upper and lower MR volumes are aligned using an alignment method, such as the method illustrated in FIG. 1.

At step 206, the lower MR volume is divided into left and right regions. When the junction between the upper and lower MR volumes is in a leg region, the lower MR volume is divided in half along the width direction into a left region L and a right region R in order to treat left and right legs independently.

Figure 3A:
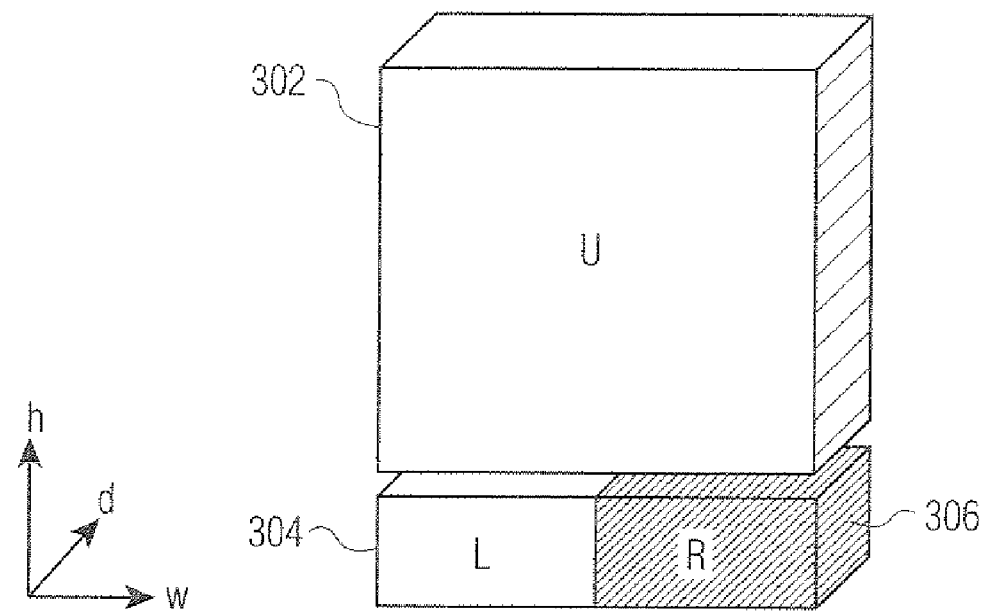
FIGS. 3A and 3B respectively illustrate aligning left and right regions of a lower MR volume with an upper MR volume.

At step 208, the left region L is aligned to the upper MR volume U. FIG. 3A illustrates aligning the left region L (304) with the upper MR volume U (302). As illustrated in FIG. 3A, the left region L (304) and the upper MR volume U (302) are both white indicating that they are being aligned, while the right region R (306) is shaded indicating that it is ignored while the left region L (304) is being aligned with the upper MR volume U (302). This is performed by replacing the original portion of the lower volume corresponding to the right region R (306) with zeroes, and aligning the left region L (304) with the upper MR volume U (302) using an alignment method, such as the method of FIG. 1. Thus, alignment parameters ($w_l$, $h_l$, $d_l$) corresponding to the width, height, and depth, respectively, of the left region L (304) are obtained.

Figure 3B:
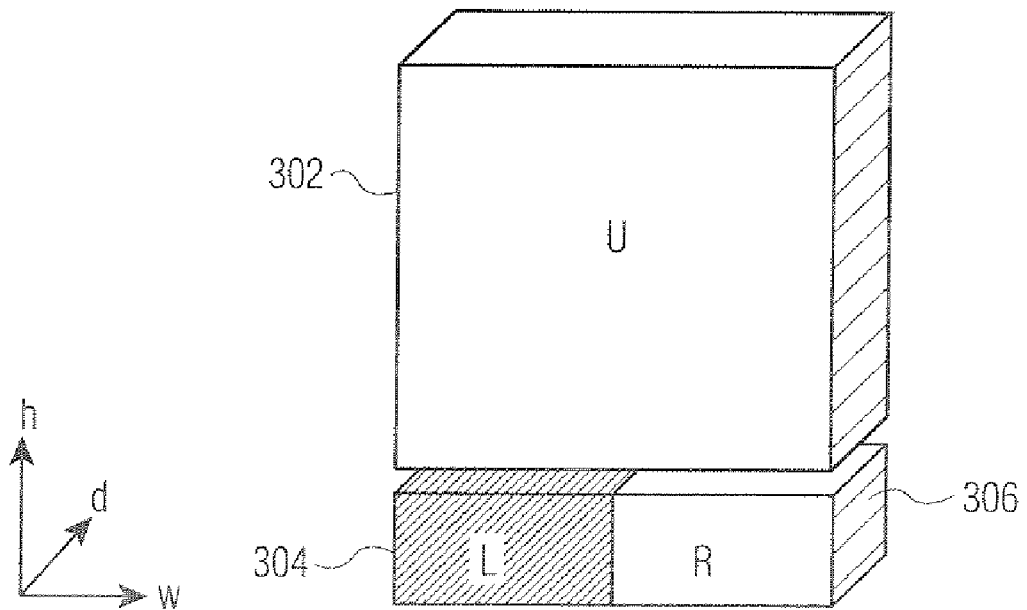

At step 210, the right region R is aligned to the upper MR volume U. FIG. 3B illustrates aligning the right region R (306) with the upper MR volume U (302). As illustrated in FIG. 3A, the right region R (306) and the upper MR volume U (302) are both white indicating that they are being aligned, while the left region L (304) is shaded indicating that it is ignored while the right region R (306) is being aligned with the upper MR volume U (302). This is performed by replacing the original portion of the lower volume corresponding to the left region L (304) with zeroes, and aligning the right region R (306) with the upper MR volume U (302) using an alignment method, such as the method of FIG. 1. Thus, alignment parameters ($w_r$, $h_r$, $d_r$) corresponding to the width, height, and depth, respectively, of the right region L (306) are obtained.

At step 212, the right region R is adjusted with respect to the left region to compensate for shifting of the legs with respect to each other. In order to adjust the right region R with respect to the left region L, a new set of parameters is determined based on the parameters obtained for the left and right regions L and R in steps 208 and 210. The new parameters determined in this step are ($w_l$, $h_l$, $d_l$, $w_r$-$w_l$, $h_r$-$h_l$), where the first three parameters ($w_r$, $h_r$, $d_r$) represent the alignment of the left leg (left region L) relative the upper MR volume U, and the last two parameters ($w_r$-$w_l$, $h_r$-$h_l$) represent shifts of the right leg (right region R) relative to the left leg (left region L). This step requires an implicit assumption that the span of each leg is restricted to the corresponding region (L or R) of the lower MR volume. This is a reasonable assumption given that the field of view can be set manually using pre-scan data as a guide.

When the relative shift of the right region R with respect to the left region L is negative (R is shifted toward L), the final voxel values in an overlapping region of L and R are determined by averaging values of the voxels in R and L. When the relative shift of the right region R with respect to the left region L is positive (R is shifted away from L), there is no overlap between L and R. In this case, new voxel values between R and L are calculated by distance related interpolation based on neighboring voxels in R and L in order to maintain visual integrity.

Step 212 results in a composition, or single MR image, of the upper and lower MR volumes. The resulting MR image can be stored, for example, in a memory or storage of a computer system, or displayed by a display device.

Although the method of FIG. 2 aligns the left region L with the upper MR volume U and then aligns the right region R with the upper MR volume U, the present invention is not limited to this order. Although step 212 describes adjusting the right region R with respect to the left region L, the present invention is not limited thereto. It is to be understood that either region can be adjusted with respect to the other region in order to compensate for relative shifts between the legs.

Figure 4:
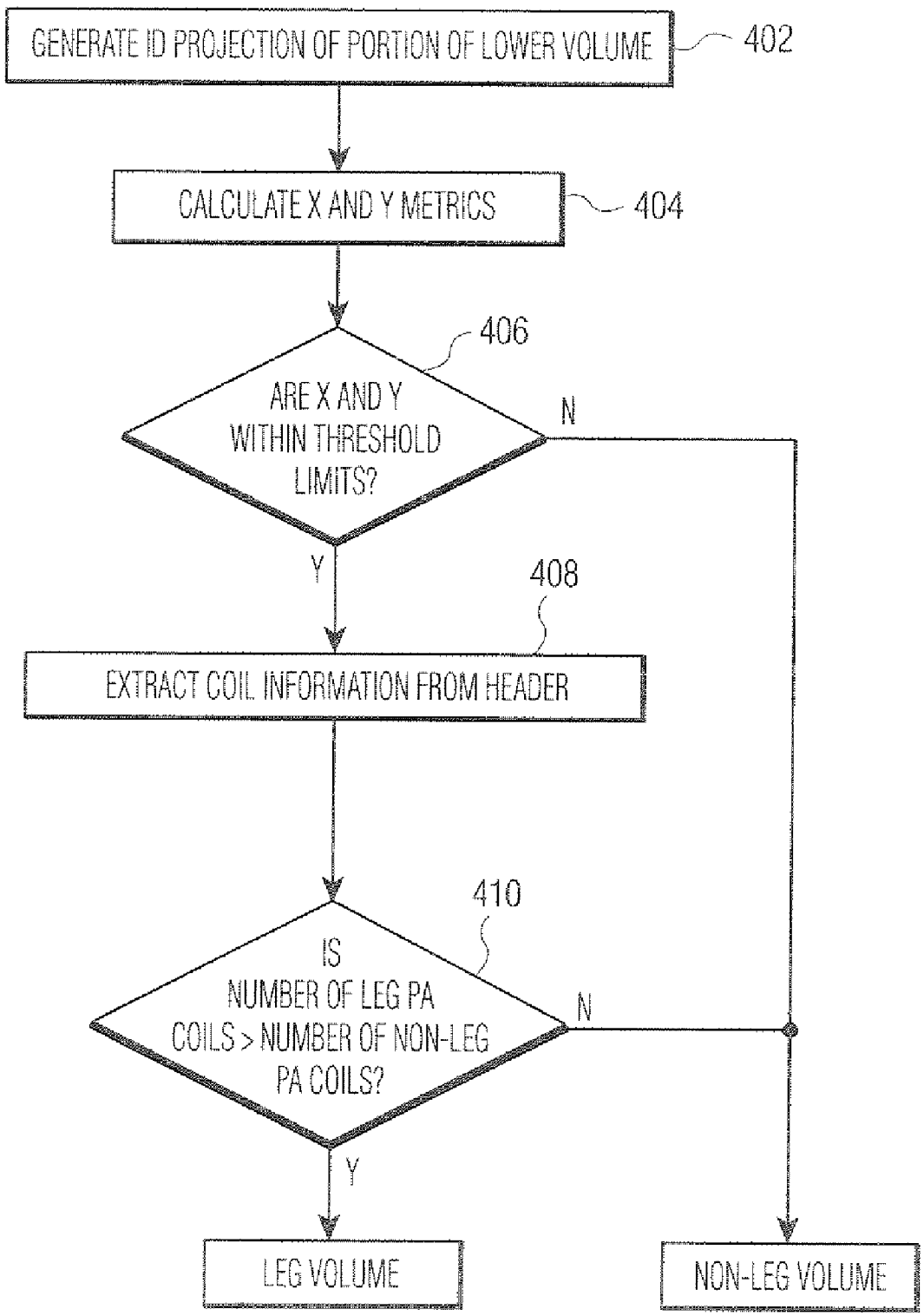
FIG. 4 illustrates a method for determining whether a junction between MR volumes is in a leg region according to an embodiment of the present invention.
Figure 5A:
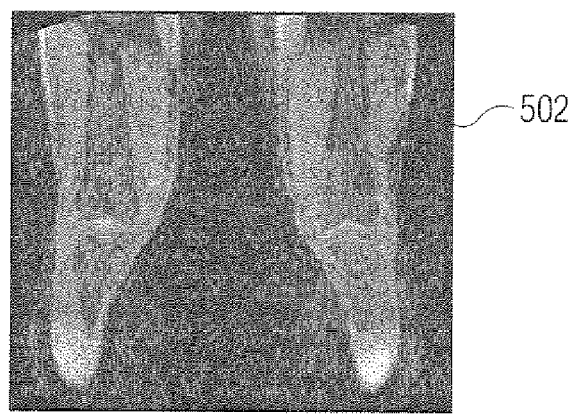
FIG. 5 illustrates exemplary projection profiles for leg and non-leg volumes.
Figure 5B:
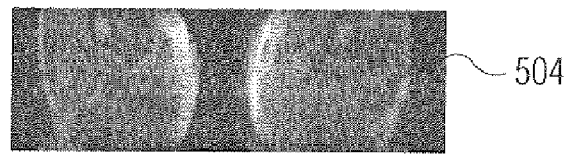
Figure 5C:
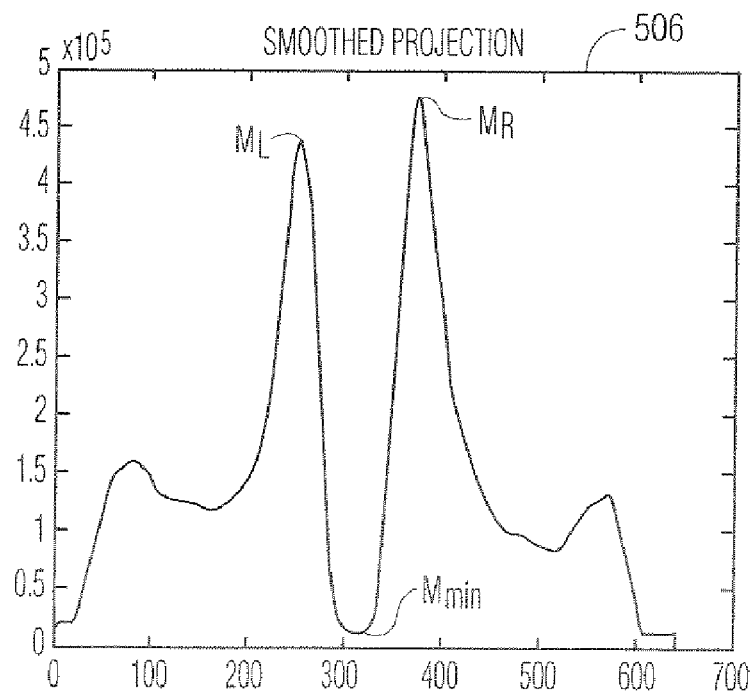
Figure 5D:
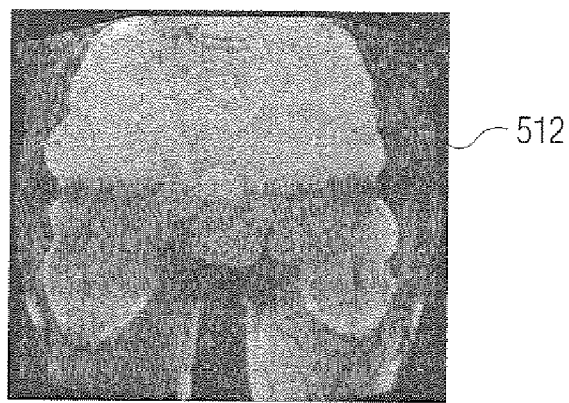
Figure 5E:
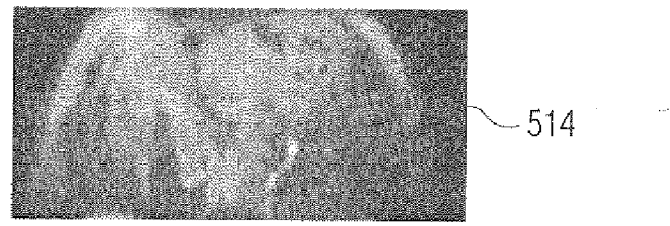
Figure 5F:
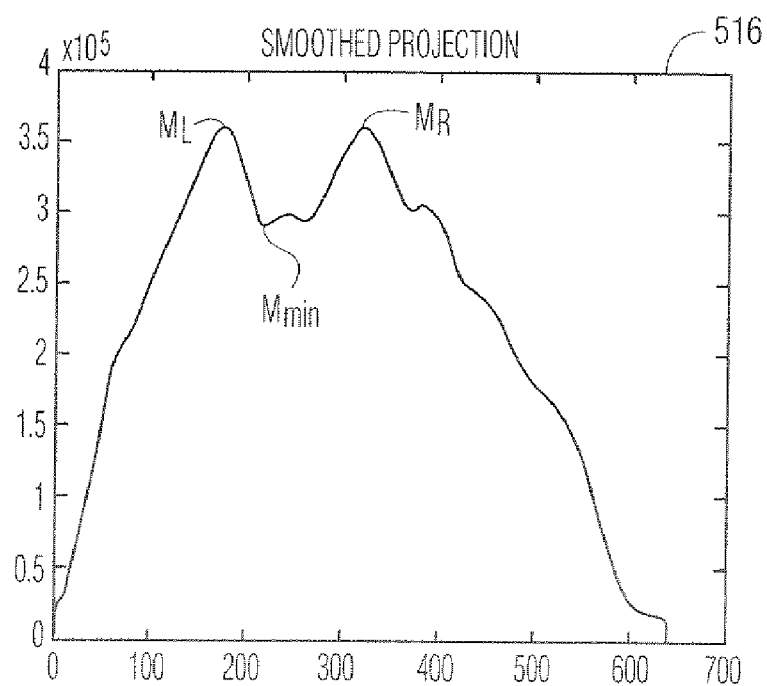

FIG. 4 illustrates a method for determining whether a junction between MR volumes is in a leg region according to an embodiment of the present invention. The method of FIG. 4 corresponds to step 202 in FIG. 2. In order to fully automate the method of FIG. 2, the determination of whether the junction between upper and lower MR volumes is in a leg region can be automated. The method of FIG. 4 automatically determines whether the junction between an upper MR volume and a lower MR volume is in a leg region using projection profiles of MR volumes and coil information embedded in the DICOM headers of the MR volume. It is possible that this method be repeated for each MR volume pair for a whole-body scan starting from the top of the body and working downward. In this case, if an iteration determines that a junction between an MR volume pair is in a leg region, the method need not be repeated and all subsequent MR volume pairs are determined to be in a leg region as well.

In order to determine whether a junction between an MR volume pair including an upper MR volume and a lower MR volume is in a leg region, the method of FIG. 4 determines whether an upper portion of the lower MR volume is in a leg region. Accordingly, the steps of this method operate on the lower MR volume of the pair. For convenience, the lower MR volume will be referred to as "the volume" hereinafter. At step 402, a 1D projection profile is generated for an upper portion of the volume. The upper portion of the volume is projected to the width direction to generate the 1D projection profile. The upper portion of the volume may include a certain number of rows (e.g., 100) of voxels at the top of the volume, The upper portion of the volume is used in order to avoid the effects of mixed volumes, i.e., MR volumes that contain both the pelvic region and the upper-leg region, which may lead to false positives.

FIG. 5 illustrates exemplary projection profiles for leg and non-leg volumes. As illustrated in FIG. 5, image 502 is a leg volume and image 512 is a pelvic volume. The projection can be visualized as being generated in two steps. First, a projection is performed along the height direction (h-axis) to yield a 2D projection with dimensionality (width (w)×depth (d)). Image 504 shows the 2D projection of the leg volume 502 along the height direction, and image 514 shows the 2D projection of the pelvic volume 512 along the height direction. The 2D projection is then projected along the depth direction (d-axis) to yield a 1D projection profile of dimensionality width (w). The 1D projection profile can then be smoothed using a spatial filter. Image 506 shows the smoothed 1D projection profile for the leg volume, and image 516 shows the smoothed 1D projection profile for the pelvic volume 512.

Returning to FIG. 4, at step 404, feature point metrics (X and Y) are calculated based on the smoothed 1D projection profile of the upper portion of the volume. In order to calculate the feature point metrics X and Y, feature points must be detected using the smoothed 1D projection profile. In order to detect the feature points the maximum with the largest magnitude is detected in the left and right halves of the smoothed 1D projection profile. These are considered the feature points in the projection profile. The magnitude of the feature points can be expressed as $M_L$ and $M_R$. The minimum with lowest magnitude that is between the two feature points in the projection profile is then found. The magnitude of this point can be expressed as $M_{min}$. Two feature point metrics, the ration of the minima to the mean of the maxima (X) and the ratio of the difference between the maxima to the mean of the maxima (Y) are calculated based on the feature points. The metrics X and Y can be expressed as:

$$X = \frac{M_{min}}{\text{mean}(M_L, M_R)}$$

$$Y = \frac{|M_L - M_R|}{\text{mean}(M_L, M_R)}.$$

Metric X has a low value if the magnitude of the feature points $M_L$ and $M_R$ are much higher than that of minimum $M_{min}$. A leg volume will typically have a small value for X because the feature points are detected in each leg and the minimum point is detected between the legs. As illustrated in image 506 of FIG. 5, in the projection profile 506 for the leg volume 502, the magnitude of the feature points $M_L$ and $M_R$ are much higher than that of the minimum $M_{min}$, resulting in a small value for X. As illustrated in image 516 of FIG. 5, in the projection profile 516 for the pelvic volume 512, the magnitude of the feature points $M_L$ and $M_R$ are not much higher than that of the minimum $M_{min}$, resulting in a larger value for X.

Metric Y has a low value when the feature points have similar magnitudes $M_L$ and $M_R$. A leg volume will typically have a small value for Y because the feature points are each detected in a leg, and the legs have symmetrical anatomic structures. As illustrated in image 506 of FIG. 5, in the projection profile 506 for the leg volume 502, the magnitudes of the feature points $M_L$ and $M_R$ are similar to each other, resulting in a small value for Y. As illustrated in image 516 of FIG. 5, in the projection profile 516 for the leg volume 512, the magnitudes of the feature points $M_L$ and $M_R$ are also similar to each other, resulting in a small value for Y.

Figure 6:
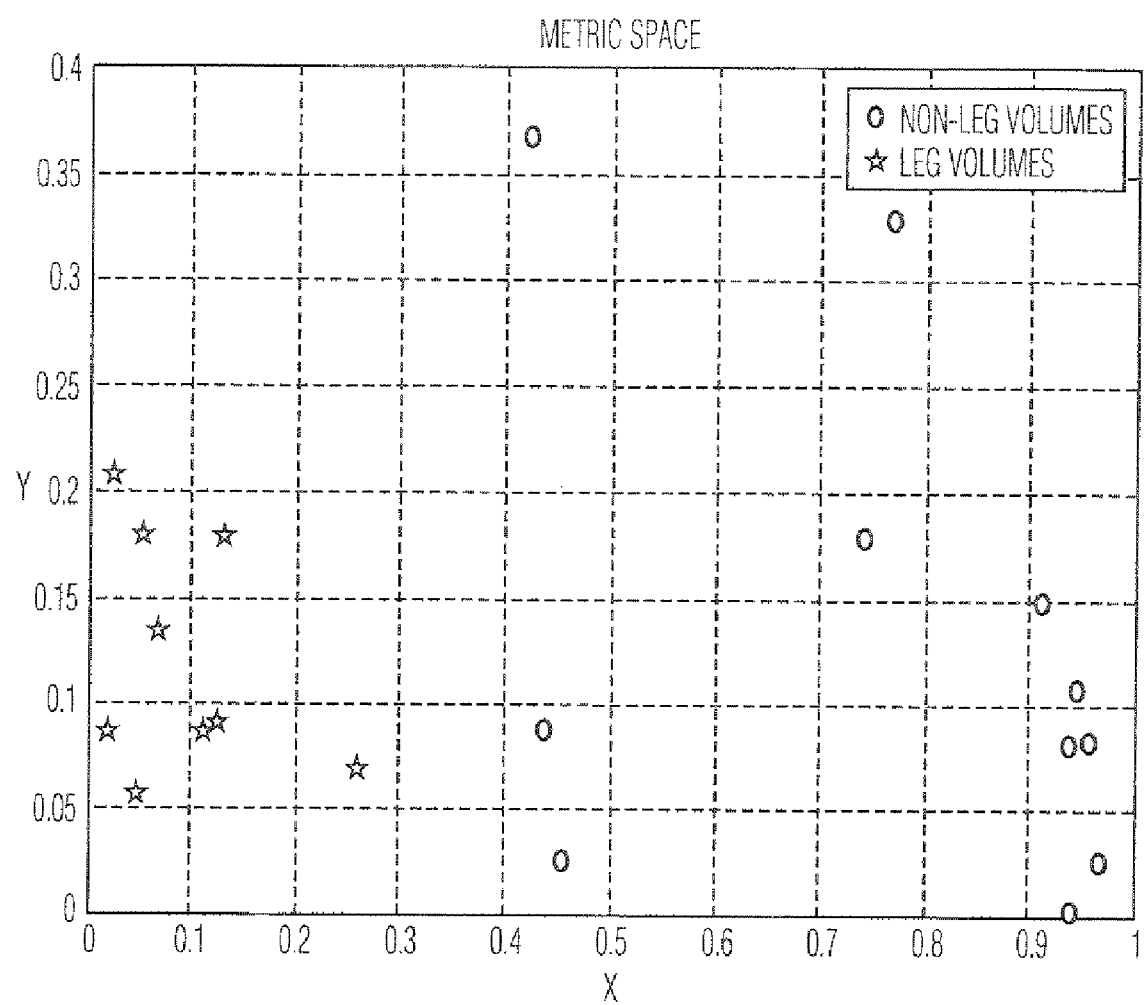
FIG. 6 illustrates a scatter plot of points representing leg and non-leg volumes plotted on a metric space for determining metric thresholds.

Returning to FIG. 4, at step 406, the X and Y metrics calculated for the projection profile of the upper portion of the volume are compared to thresholds to determine whether X and Y are within threshold limits. The thresholds can be set based on patterns of the X and Y metrics in training data sets. FIG. 6 illustrates a scatter plot of points representing leg and non-leg volumes plotted on a metric space for determining metric thresholds. As illustrated in FIG. 6, the values of the X and Y metrics are both low for leg volumes (shown as stars). This is because in leg volumes, the feature points correspond to projections of the legs, thus having high and nearly equal magnitudes, and the minimum is between the legs and constitutes noise, thus having a very low magnitude. As illustrated in FIG. 6, for non-leg volumes (shown as circles), X is higher than for leg volumes and Y does not follow any particular pattern. Based on the scatter plot of FIG. 6, maximum X and Y thresholds can be determined.

If either of the X and Y metrics calculated for the projection profile of the upper portion of the volume violated the corresponding threshold, it is determined that the volume is not a leg volume, and the junction between the volume pair is not in a leg region. If the calculated X and Y metrics satisfy both of the corresponding thresholds, the method proceeds to step 408.

Figure 7A:
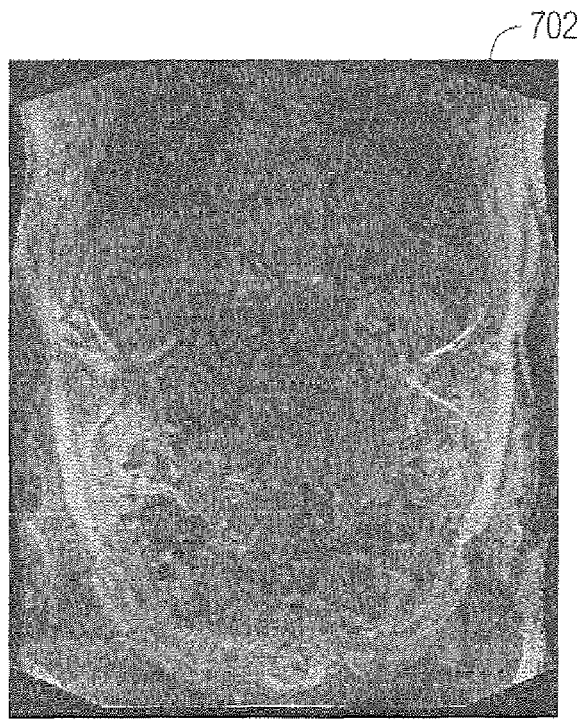
FIG. 7 illustrates a projection profile for an exemplary chest volume.
Figure 7B:
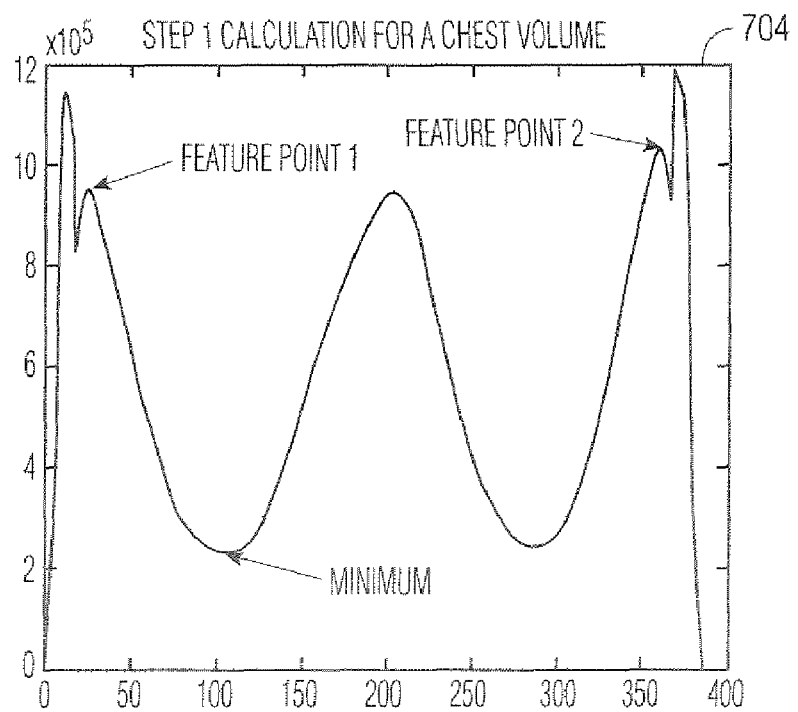
Figure 8A:
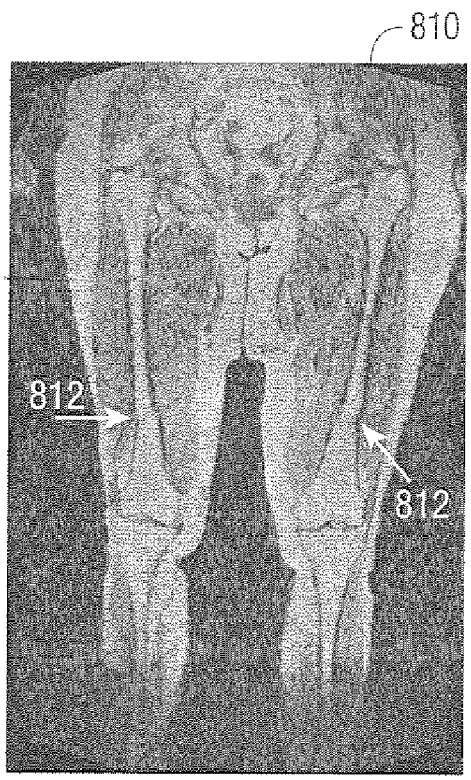
FIG. 8 illustrates exemplary results of aligning MR leg-volumes according to an embodiment of the present invention.
Figure 8B:
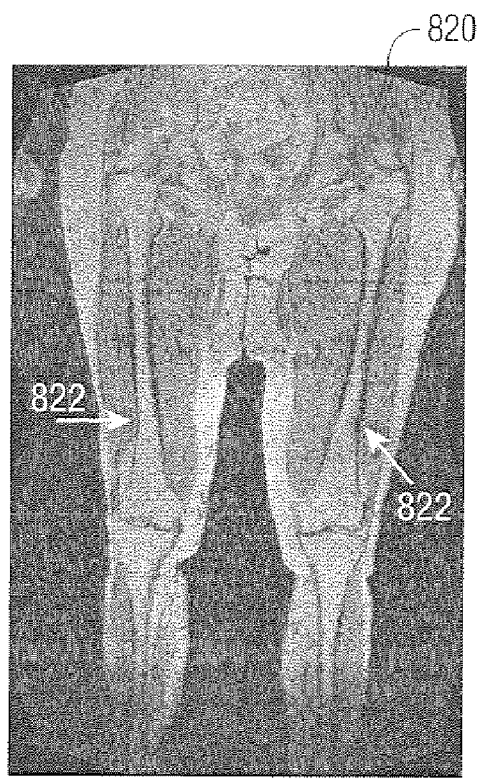
Figure 8C:
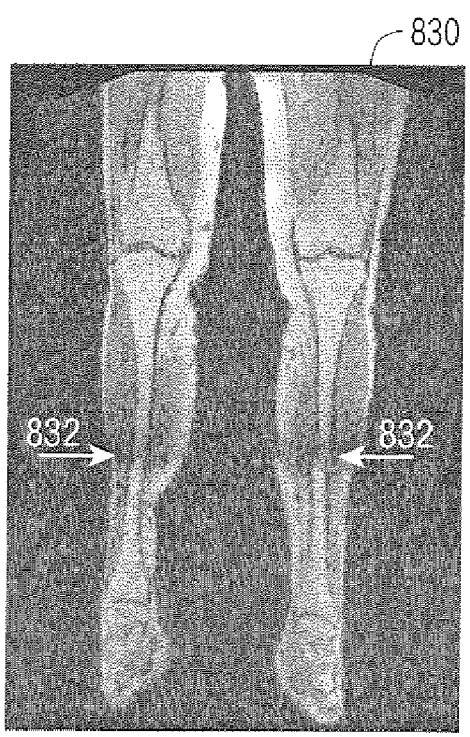
Figure 8D:
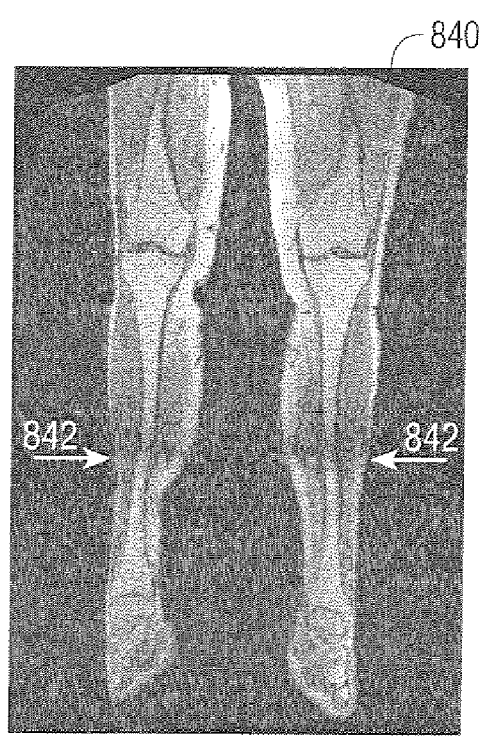

Although steps 402-406 are effective for differentiating a pelvic volume from a leg volume, these steps may not be effective for chest volumes. FIG. 7 illustrates an exemplary chest volume 702 and a 1D projection profile 704 for the chest volume 702. As illustrated in FIG. 7, the feature points detected in the projection profile 704 have high and nearly equal magnitudes, and the minimum point has a much lower magnitude. Thus, the values of X and Y for the projection profile 704 of the chest volume 702 may satisfy the corresponding thresholds of step 406. Accordingly, after a volume satisfies step 406, the volume is further processed to ensure that it is a leg volume.

At step 408, coil information is extracted from the DICOM headers of the volumes. If a volume has a leg region, peripheral angio (PA) coils are used to acquire the images (slices) for the volume. If the volume is not a leg volume, there should be no PA coils used to acquire the images. However, it may be possible that a user selects a PA coil by accident in the image acquisition process, even though the volume is of a non-leg region and there is no need for a PA coil. Accordingly, at step 410, the number of PA coils and non-PA coils used to acquire the images (slices) in the volume are compared. If the number of PA coils is greater than a number of non-PA coils, the volume is determined to be a leg volume, and the junction between the volume pair is determined to be in a leg region. If the number of PA coils is not greater than a number of no-PA coils, the volume is determined to be a non-leg volume, and the junction between the volume pair is not in a leg region.

FIG. 8 illustrates exemplary results of aligning MR leg-volumes according to an embodiment of the present invention. As illustrated in FIG. 8, image 810 is a composite MR image formed by aligning a first exemplary MR volume pair using the method of FIG. 1 and image 820 is a composite MR image formed by aligning the first exemplary MR volume pair using the method FIG. 2 according to an embodiment of the present invention. In image 810, reference numeral 812 refers to portion of image 810 that is not well-aligned. In image 820, reference numeral 822 shows that this portion of image 820 is well-aligned. Image 830 is a composite MR image formed by aligning a second exemplary MR volume pair using the method of FIG. 1 and image 840 is a composite MR image formed by aligning the second exemplary MR volume pair using the method FIG. 2 according to an embodiment of the present invention. In image 830, reference numeral 832 refers to portion of image 830 that is not well-aligned. In image 840, reference numeral 842 shows that this portion of image 840 is well-aligned.

Figure 9:
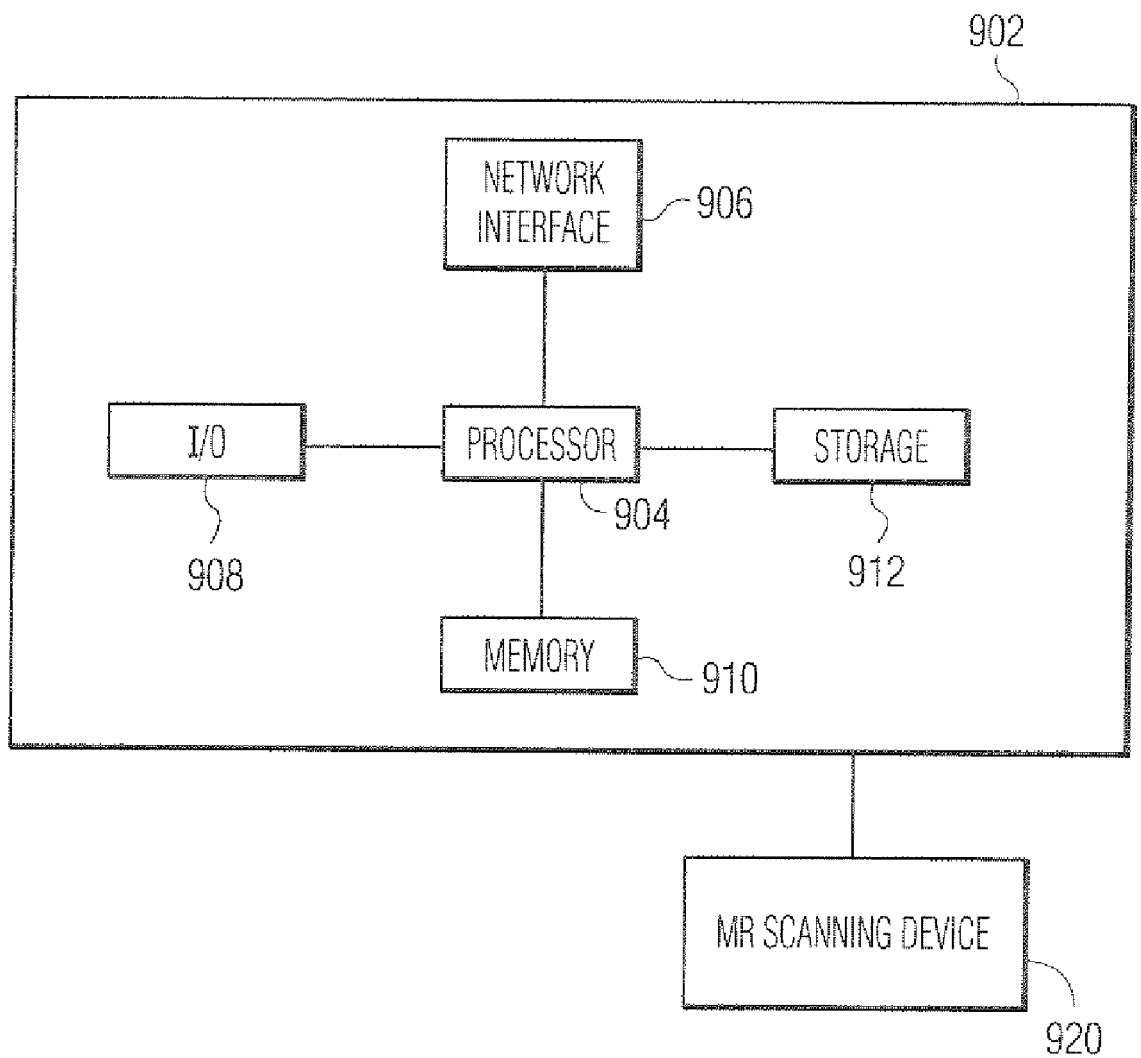
FIG. 9 is a high level block diagram of a computer capable of implementing the present invention.

The above-described methods for aligning MR volumes can be implemented on a computer using well-known computer processors, memory units, storage devices, computer software, and other components. A high level block diagram of such a computer is illustrated in FIG. 9. Computer 902 contains a processor 904 which controls the overall operation of the computer 902 by executing computer program instructions which define such operation. The computer program instructions may be stored in a storage device 912 (e.g., magnetic disk) and loaded into memory 910 when execution of the computer program instructions is desired. Thus, applications for performing the above described method steps can be defined by the computer program instructions stored in the memory 910 and/or storage 912 and controlled by the processor 904 executing the computer program instructions. Furthermore, image data corresponding to MR volumes can be stored in the memory 910 and/or the storage 912. An MR scanning device 920 which generate MR images can be connected to the computer 902 to input MR images to the computer 902. It is possible to implement the MR scanning device and the computer 902 as one device. It is also possible the MR scanning device 920 and the computer 902 communicate wirelessly through a network. The computer 902 also includes one or more network interfaces 906 for communicating with other devices via a network. The computer 902 also includes other input/output devices 908 that enable user interaction with the computer 902 (e.g., display, keyboard, mouse, speakers, buttons, etc.) One skilled in the art will recognize that an implementation of an actual computer could contain other components as well, and that FIG. 9 is a high level representation of some of the components of such a computer for illustrative purposes.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

What is claimed is:

1. A method for aligning upper and lower MR volumes, comprising:
   determining whether a junction between said upper and lower MR volumes is in a leg region;
   dividing said lower MR volume into left and right regions in response to a determination that the junction between said upper and lower MR volumes is in the leg region;
   independently aligning each of said left and right regions with said upper MR volume; and
   adjusting one of said left and right regions with respect to the other one of said left and right regions.

2. The method of claim 1, further comprising:
   displaying a composite MR image generated by said aligning and adjusting steps.

3. The method of claim 1, wherein said step of determining whether a junction between said upper and lower MR volumes is in a leg region comprises:
   (a) determining whether said junction is in a leg region based on a 1D projection profile of an upper portion of said lower MR volume; and
   (b) if it is determined that said junction is in a leg region in step (a), determining whether said junction is in a leg region based on coil information associated with said lower MR volume.

4. The method of claim 3, wherein step (a) comprises:
   generating said 1D projection profile by projecting said upper portion of said lower MR volume to a width direction;
   calculating at least one feature point metric based on said 1D projection profile;
   comparing said at least one feature point metric to a corresponding at least one threshold;
   if said at least one feature point value satisfies said corresponding at least one threshold, determining that said junction is in a leg region; and
   if said at least one feature point value does not satisfy said corresponding at least one threshold, determining that said junction is not in a leg region.

5. The method of claim 4, wherein said step of calculating at least one feature point metric based on said 1D projection profile comprises:
   detecting first and second feature points in said 1D projection profile as maximums having a highest magnitude in left and right halves of said 1D projection profile, respectively;
   detecting a minimum point in said 1D projection profile with a lowest magnitude between said first and second feature points;
   calculating a first metric as a ratio of the magnitude of the minimum point to a mean of the magnitudes of the first and second feature points; and calculating a second metric as a ratio of a difference between the magnitudes of the first and second feature points to the mean of the magnitudes of the first and second feature points.

6. The method of claim 3, wherein said lower MR volume is stored in a DICOM format, and step (b) comprises:
   extracting said coil information associated with said lower MR volume from a DICOM header of said lower MR volume;
   comparing a number of peripheral angio (PA) coils in said coil information with a number of non-PA coils in said coil information;
   if the number of PA coils is greater than the number of non-PA coils, determining that said junction is in a leg region; and
   if the number of PA coils is not greater than the number of non-PA coils, determining that said junction is not in a leg region.

7. The method of claim 1, wherein the junction of said upper and lower MR volumes is in a leg region.

8. The method of claim 7, wherein said step of adjusting one of said left and right regions with respect to the other one of said left and right regions comprises:
   compensating for shifts between left and right legs in said upper and lower MR volumes.

9. The method of claim 1, wherein said step of independently aligning each of said left and right regions with said upper MR volume comprises:
   calculating alignment parameters for said left region based on correlation of features between said left region and said upper MR volume; and
   calculating alignment parameters for said right region based on correlation of features between said right region and said upper MR volume.

10. The method of claim 9, wherein said step of adjusting one of said left and right regions with respect to the other one of said left and right regions comprises:
    adjusting the alignment parameters of said one of said left and right regions by subtracting the alignment parameters of said other one of said left and right regions.

11. An apparatus for aligning upper and lower MR volumes, comprising:
    means for determining whether a junction between said upper and lower MR volumes is in a leg region;
    means for dividing said lower MR volume into left and right regions;
    means for independently aligning each of said left and right regions with said upper MR volume; and
    means for adjusting one of said left and right regions with respect to the other one of said left and right regions.

12. The apparatus of claim 11, wherein said means for determining whether a junction between said upper and lower MR volumes is in a leg region comprises:
    means for determining whether said junction is in a leg region based on a 1D projection profile of an upper portion of said lower MR volume; and
    means for determining whether said junction is in a leg region based on coil information associated with said lower MR volume.

13. The apparatus of claim 12, wherein said means for determining whether said junction is in a leg region based on a 1D projection profile of an upper portion of said lower MR volume comprises:
    means for generating said 1D projection profile by projecting said upper portion of said lower MR volume to a width direction;
    means for calculating at least one feature point metric based on said 1D projection profile; and
    means for comparing said at least one feature point metric to a corresponding at least one threshold.

14. The apparatus of claim 12, wherein said lower MR volume is stored in a DICOM format, and said means for determining whether said junction is in a leg region based on coil information associated with said lower MR volume comprises:
    means for extracting said coil information associated with said lower MR volume from a DICOM header of said lower MR volume; and
    means for comparing a number of peripheral angio (PA) coils in said coil information with a number of non-PA coils in said coil information.

15. The apparatus of claim 11, wherein said means for independently aligning each of said left and right regions with said upper MR volume comprises:
    means for calculating alignment parameters for said left region based on correlation of features between said left region and said upper MR volume; and
    means for calculating alignment parameters for said right region based on correlation of features between said right region and said upper MR volume.

16. The apparatus of claim 15, wherein said means for adjusting one of said left and right regions with respect to the other one of said left and right regions comprises:
    means for adjusting the alignment parameters of said one of said left and right regions by subtracting the alignment parameters of said other one of said left and right regions.

17. A non-transitory computer readable medium encoded with computer executable instructions for aligning upper and lower MR volumes, the computer executable instructions defining steps comprising:
    determining whether a junction between said upper and lower MR volumes is in a leg region;
    dividing said lower MR volume into left and right regions in response to a determination that the junction between said upper and lower MR volume is in the leg region;
    independently aligning each of said left and right regions with said upper MR volume; and
    adjusting one of said left and right regions with respect to the other one of said left and right regions.

18. The computer readable medium of claim 17, wherein the computer executable instructions defining the step of determining whether a junction between said upper and lower MR volumes is in a leg region comprise computer executable instructions defining the steps of:
    (a) determining whether said junction is in a leg region based on a 1D projection profile of an upper portion of said lower MR volume; and
    (b) if it is determined that said junction is in a leg region in step (a), determining whether said junction is in a leg region based on coil information associated with said lower MR volume.

19. The computer readable medium of claim 18, wherein the computer executable instructions defining step (a) comprise computer executable instructions defining the steps of:
    generating said 1D projection profile by projecting said upper portion of said lower MR volume to a width direction;
    calculating at least one feature point metric based on said 1D projection profile;
    comparing said at least one feature point metric to a corresponding at least one threshold;

if said at least one feature point value satisfies said corresponding at least one threshold, determining that said junction is in a leg region; and if said at least one feature point value does not satisfy said corresponding at least one threshold, determining that said junction is not in a leg region.

20. The computer readable medium of claim 19, wherein the computer executable instructions defining the step of calculating at least one feature point metric based on said 1D projection profile comprise computer executable instructions defining the steps of:

detecting first and second feature points in said 1D projection profile as maximums having a highest magnitude in left and right halves of said 1D projection profile, respectively;

detecting a minimum point in said 1D projection profile with a lowest magnitude between said first and second feature points;

calculating a first metric as a ratio of the magnitude of the minimum point to a mean of the magnitudes of the first and second feature points; and calculating a second metric as a ratio of a difference between the magnitudes of the first and second feature points to the mean of the magnitudes of the first and second feature points.

21. The computer readable medium of claim 18, wherein said lower MR volume is stored in a DICOM format, and the computer executable instructions defining step (b) comprise computer executable instructions defining the steps of:

extracting said coil information associated with said lower MR volume from a DICOM header said lower MR volume;

comparing a number of peripheral angio (PA) coils in said coil information with a number of non-PA coils in said coil information;

if the number of PA coils is greater than the number of non-PA coils, determining that said junction is in a leg region; and if the number of PA coils is not greater than the number of non-PA coils, determining that said junction is not in a leg region.

22. The computer readable medium of claim 17, wherein:

the computer executable instructions defining the step of independently aligning each of said left and right regions with said upper MR volume comprise computer executable instructions defining the steps of:

calculating alignment parameters for said left region based of correlation of features between said left region and said upper MR volume, and calculating alignment parameters for said right region based of correlation of features between said right region and said upper MR volume; and the computer program instructions defining the step of adjusting one of said left and right regions with respect to the other one of said left and right regions comprise computer program instructions defining the step of:

adjusting the alignment parameters of said one of said left and right regions by subtracting the alignment parameters of said other one of said left and right regions.

\* \* \* \* \*